United States Patent
Luo et al.

(10) Patent No.: US 7,781,235 B2
(45) Date of Patent: Aug. 24, 2010

(54) CHIP-PROBING AND BUMPING SOLUTIONS FOR STACKED DIES HAVING THROUGH-SILICON VIAS

(75) Inventors: Wen-Liang Luo, Toufen Town (TW); Yung-Liang Kuo, Hsin-Chu (TW); Hsu Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 700 days.

(21) Appl. No.: 11/644,397

(22) Filed: Dec. 21, 2006

(65) Prior Publication Data
US 2008/0153187 A1    Jun. 26, 2008

(51) Int. Cl.
*H01L 21/66* (2006.01)
(52) U.S. Cl. .................. 438/14; 438/17; 257/E21.524
(58) Field of Classification Search ............. 438/17, 438/14, 15; 324/758; 257/E21.524
See application file for complete search history.

(56) References Cited

U.S. PATENT DOCUMENTS

| | | | |
|---|---|---|---|
| 7,157,352 B2 * | 1/2007 | Yamanaka | 438/458 |
| 2005/0014311 A1 * | 1/2005 | Hayasaka et al. | 438/109 |
| 2007/0045875 A1 * | 3/2007 | Farnworth et al. | 257/787 |
| 2009/0017565 A1 * | 1/2009 | Hasebe et al. | 438/17 |

* cited by examiner

*Primary Examiner*—Michael Trinh
(74) *Attorney, Agent, or Firm*—Slater & Matsil, L.L.P.

(57) ABSTRACT

A method of forming a semiconductor structure includes providing a stack structure having a first side and a second side opposite the first side. The stack structure includes a bottom wafer comprising a substrate; a plurality of through-silicon vias in the substrate; and a plurality of under bump metallurgies (UBMs) connected to the plurality of through-silicon vias, wherein the UBMs are on the first side of the stack structure. The method further includes attaching a handling wafer on the second side of the stack structure; performing a chip probing process; and removing the handling wafer from the stack structure.

20 Claims, 12 Drawing Sheets

CHIP-PROBING AND BUMPING SOLUTIONS FOR STACKED DIES HAVING THROUGH-SILICON VIAS

TECHNICAL FIELD

This invention relates generally to integrated circuits, and more particularly to three-dimensional integrated circuits (3D IC), and even more particularly to 3D IC with through-silicon vias.

BACKGROUND

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits (3D IC) are therefore created to resolve the above-discussed limitations. In a typical formation process of 3D IC, two wafers, each including an integrated circuit, are formed. The wafers are then bonded with the devices aligned. Deep vias are then formed to interconnect devices on the first and second wafers.

Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Conventional methods for forming 3D IC also include die-to-wafer bonding, wherein separate dies are bonded to a common wafer. An advantageous feature of the die-to-wafer bonding is that the size of the dies may be smaller than the size of chips on the wafer.

Recently, through-silicon vias, also referred to as through-wafer vias, are increasingly used as a way of implementing 3D IC. FIG. 1 illustrates a conventional 3D IC including through-silicon vias, wherein bottom wafer 2 is bonded to top wafer 4. Both wafers 2 and 4 include integrated circuits (not shown). The integrated circuits in bottom wafer 2 are connected to the integrated circuits in wafer 4 through interconnect structures 6 and 8. The integrated circuits in wafers 2 and 4 are further connected to external pads 12 through through-silicon vias 10. The structure shown in FIG. 1 is typically referred to as having a pads-on-top structure, indicating that external pads 12 are formed on top of the stacked wafers.

Typically, before the stacked wafers are sawed, the chips in the stacked wafers are probed using probe head 16. Chip probing is a wafer level technology for determining the quality of dies on wafers. The chips are tested before they are sawed from wafers, and only those chips that pass the probe tests are packaged. By identifying problematic chips at an early stage, packaging costs are saved. In the structure shown in FIG. 1, bottom wafer 2 is not thinned, and thus the illustrated structure is robust enough to sustain the probing process.

With the increasing demand of high-density integrated circuits, more layers of wafers/dies need to be stacked together, and thus a structure shown in FIG. 2 is explored. In this structure, dies 22 and 24 are stacked on bottom wafer 20, wherein each of the dies 22, 24 and bottom wafer 20 includes integrated circuits. Besides through-silicon vias 26 formed in dies 22, through-silicon vias 28 are also formed in bottom wafer 20 and connected to pads 30, on which ball grid array balls 32 are mounted. The structure shown in FIG. 2 is typically referred to as a pads-on-bottom structure. Since through-silicon vias can only be formed in thin wafers, bottom wafer 20 needs to be thinned. This results in a structure too thin for the chip probing. For example, dies 22 and 24 may have a thickness of about one mil, and bottom wafer 20 may have a thickness of about 3 mils. The thin stack structure is advantageous for building highly integrated circuits. However, the total thickness of 5 mils is not thick enough for the chip probing, which may break the stack structure. Typically, the stack structures formed on eight-inch wafers preferably have a total thickness of greater than about 19 mils. The stack structures formed on twelve-inch wafers preferably have a total thickness of greater than about 21 mils. The conflicting requirements for the thicknesses of the stack structure cause a dilemma.

Accordingly, what is needed in the art is a structure and formation methods for forming 3D IC having through-silicon vias, so that both the reliability of the manufacturing process and the high degree of integration can be satisfied.

SUMMARY OF THE INVENTION

In accordance with one aspect of the present invention, a method of forming a semiconductor structure includes providing a stack structure having a first side and a second side opposite the first side. The stack structure includes a bottom wafer comprising a substrate and a plurality of through-silicon vias in the substrate. A plurality of under bump metallurgies (UBMs) are connected to the plurality of through-silicon vias, wherein the UBMs are on the first side of the stack structure. The method further includes attaching a handling wafer on the second side of the stack structure; performing a chip probing process; and removing the handling wafer from the stack structure.

In accordance with another aspect of the present invention, a method of forming a semiconductor structure includes providing a bottom wafer comprising a substrate and forming an interconnect structure on the bottom wafer. A first plurality of bonding pads are formed on the interconnect structure. The method further includes bonding a first plurality of dies on the bottom wafer, wherein each of the first plurality of dies comprises a first plurality of through-silicon vias and a second plurality of bonding pads connected to the first plurality of through-silicon vias, and wherein each of the first plurality of bonding pads is bonded to one of the second plurality of bonding pads. The method further includes forming a second plurality of through-silicon vias in the substrate of the bottom wafer. A plurality of UBMs is formed on the first side of the bottom wafer, wherein the plurality of UBMs are connected to the second plurality of through-silicon vias. A plurality of bumps each is mounted on one of the UBMs. A handling wafer is attached over the first plurality of dies, wherein the handling wafer and the bottom wafer are on opposite sides of the first plurality of dies. A chip probing process is then performed, followed by removing the handling wafer from the semiconductor structure. The semiconductor structure is then sawed.

In accordance with yet another aspect of the present invention, a method of probing dies includes providing a stack structure having a first thickness less than a required thickness for a chip probing process, wherein the stack structure comprises a bottom wafer. A handling wafer is attached on the stack structure to increase the first thickness of the stack structure to a second thickness greater than the required thickness. Dies on the stack structure are probed. The handling wafer is removed after the step of probing. Then the stack structure is sawed into separate dies.

In accordance with yet another aspect of the present invention, a semiconductor structure includes a bottom wafer comprising a substrate and an interconnect structure on the substrate. A first plurality of bonding pads are located on the interconnect structure. A first plurality of through-silicon vias are formed in the substrate. A plurality of UBMs are connected to the first plurality of through-silicon vias, wherein the plurality of UBMs are on a first side of the bottom wafer. The semiconductor structure further includes a first plurality of dies bonded to the first bonding pads of the bottom wafer, wherein each of the first plurality of dies comprises a second plurality of through-silicon vias. A plurality of bumps each is mounted on one of the UBMs. A handling wafer is mounted over the first plurality of dies, wherein the handling wafer and the bottom wafer are on opposite sides of the first plurality of dies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The cross-sectional views of intermediate stages for forming a three-dimensional integrated circuit (3D IC) are illustrated in FIGS. 3 through 12 and discussed. The variations of the preferred embodiments are then discussed. Throughout the various views and illustrative embodiments of the present invention, like reference numbers are used to designate like elements.

Figure 1:
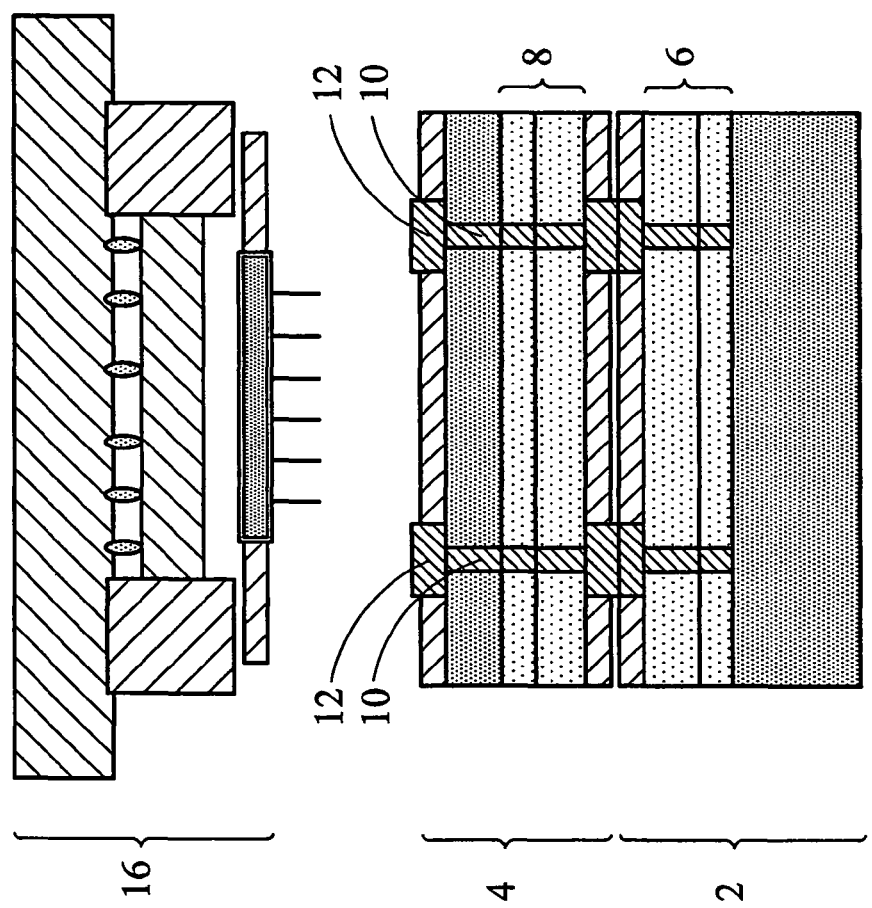
FIG. 1 illustrates a conventional 3D IC including through-silicon vias, wherein a bottom wafer is not thinned.
Figure 2:
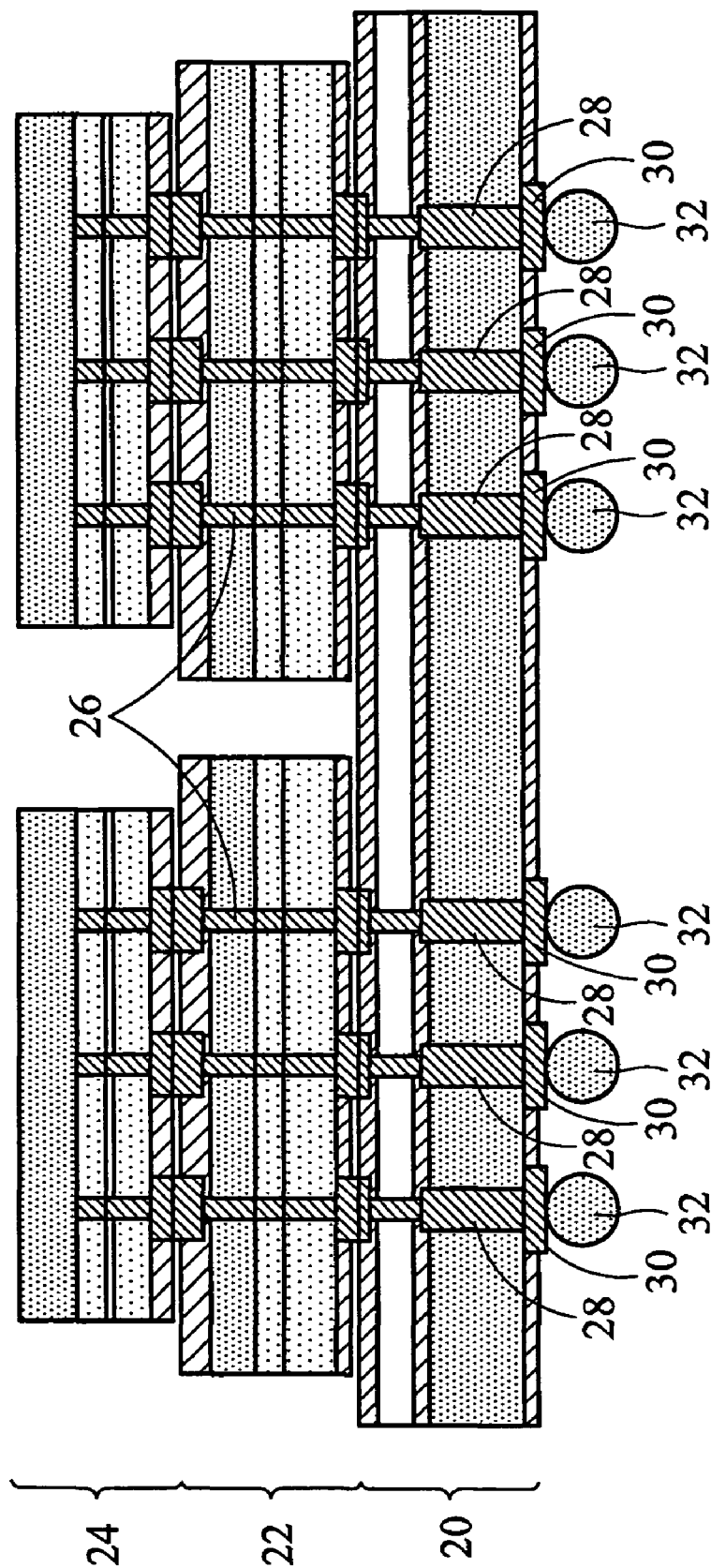
FIG. 2 illustrates a conventional 3D IC including through-silicon vias, wherein a bottom wafer is thinned.
Figure 3:
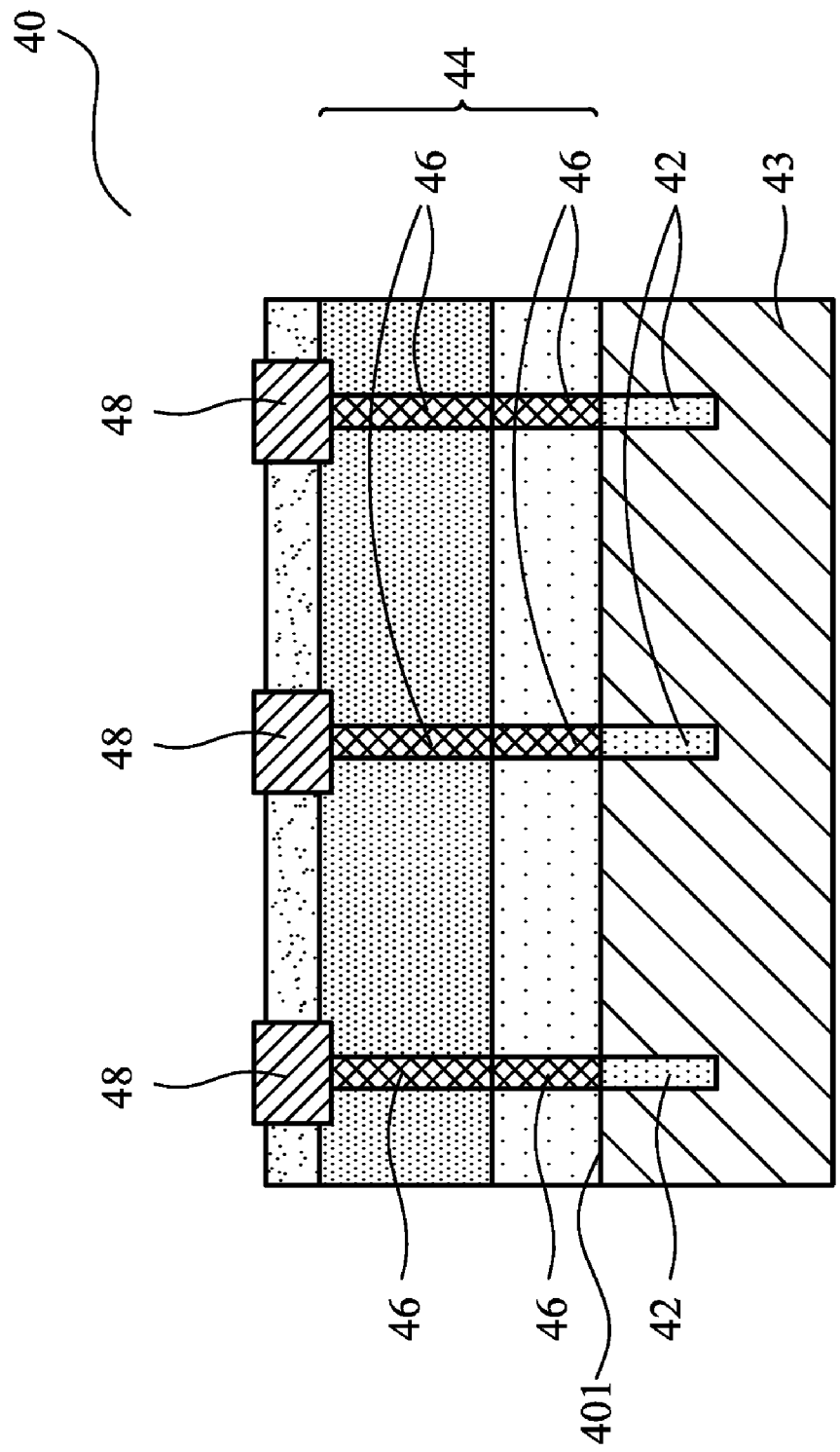
FIGS. 3 through 12 illustrate cross-sectional views of the intermediate stages in the manufacturing of an embodiment of the present invention.

FIG. 3 illustrates die 40, which will be bonded to a semiconductor wafer. Die 40 includes semiconductor substrate 43, wherein integrated circuits (not shown) are formed at surface 401 of substrate 43. Semiconductor substrate 43 may be formed of silicon or other semiconductor material such as SiGe and compounds of group III and group IV elements. Deep plugs 42 are formed in semiconductor substrate 43 and are physically connected to the integrated circuits through interconnect structure 44. More specifically, deep plugs 42 are physically connected to contact plugs in interconnect structure 44. As is known in the art, interconnect structure 44 includes a plurality of metallization layers, which are schematically illustrated as metal connections 46 formed in dielectric layers.

Preferably, deep plugs 42 are formed before the formation of the integrated circuits and interconnect structure 44. The formation of deep plugs 42 includes etching semiconductor substrate 43 to form openings, and then filling the openings. The etching may be a dry etching with the assist of plasma. Alternatively, the openings may be formed by laser drilling. The openings are then filled with a material having different etching characteristics from semiconductor substrate 43, preferably a dielectric material. Die 40 further includes bonding pads 48 on the top of interconnect structure 44 and connected to the integrated circuits through interconnect structure 44.

Bonding pads 48 may include metals such as copper, tungsten and aluminum, alloys such as CuSn, AuSn, InAu, PbSn, and combinations thereof. The formation processes for interconnect structure 44 and bonding pads 48 are well known in the art, and thus are not repeated herein. One skilled in the art will realize that die 40 is preferably fabricated as a part of a wafer and sawed from the wafer after interconnect structure 44 and bonding pads 48 are formed.

Figure 4:
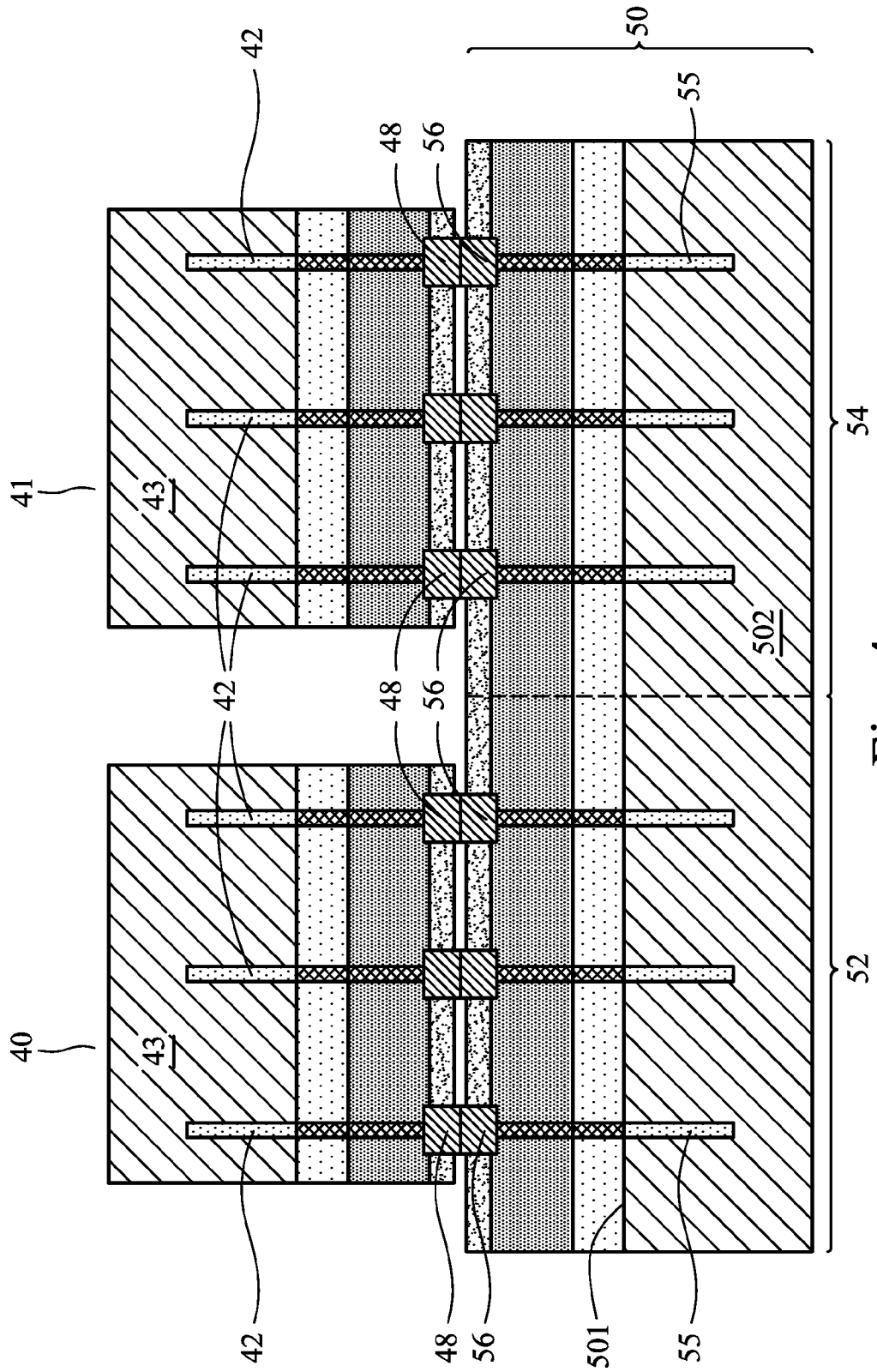

Referring to FIG. 4, die 40 is flipped upside-down and placed against wafer 50. For simplicity, only dies 52 and 54 in wafer 50 are illustrated, although a wafer will contain a plurality of identical dies. Dies 52 and 54 include integrated circuits (not shown) formed on the surface 501 of substrate 502 of wafer 50. In FIG. 4, die 40 is placed against die 52, and another die 41, which has an identical structure as die 40, is placed against die 54. Preferably, each of the plurality of dies in wafer 50 is bonded with at least one die, and maybe more. Such a bonding is typically referred to as a die-to-wafer bonding. Similar to die 40, dies 52 and 54 may also include integrated circuits (not shown) formed therein. Bonding pads 56 on dies 52 and 54 are aligned with bonding pads 48 on dies 40 and 41, respectively, and may be bonded using direct copper bonding (also referred to copper-to-copper bonding, although bonding pads 48 and 56 may include other elements other than copper.). FIG. 4 also illustrates deep plugs 55 formed in wafer 50, wherein the deep plugs 55 are for the formation of through-silicon vias.

Figure 5:
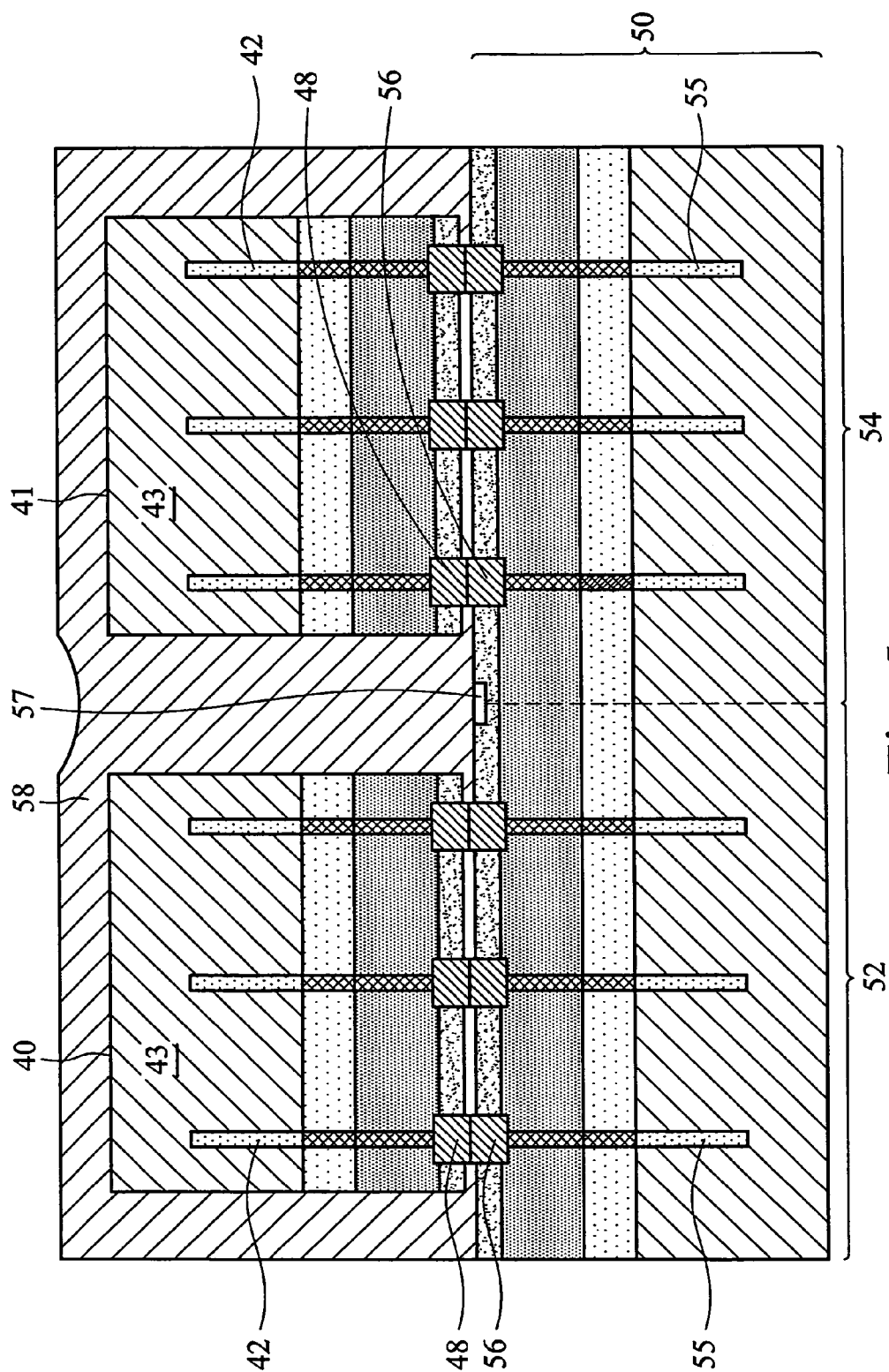

FIG. 5 illustrates the filling of coating 58 into the spacing between dies 40 and 41. The gap-filling materials are preferably at least semi-transparent, and more preferably transparent, so that marks 57 on wafer 50 may be identified through coating 58. The exemplary gap-filling materials of coating 58 include epoxy, polyimide, and combinations thereof. The formation methods include spin coating, dipping, and the like. Preferably coating 58 is dense enough so that it also has the function of preventing moisture and chemicals from penetrating through it to reach dies 40 and 41.

Figure 6:
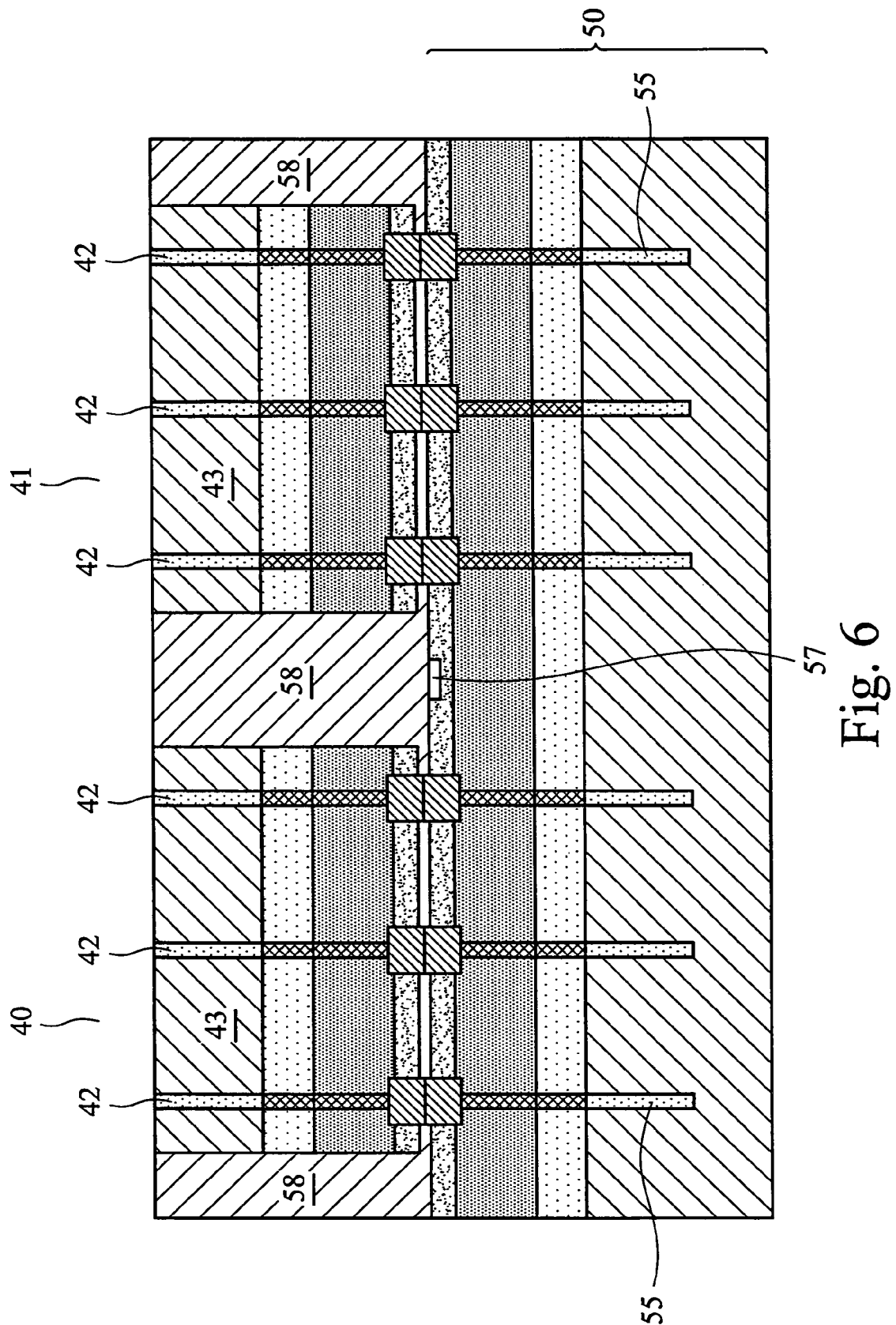

Referring to FIG. 6, a chemical mechanical polish (CMP) is preformed to remove excess portions of coating 58 and portions of substrates 43 from each of the dies 40 and 41, until deep plugs 42 are exposed. Alternatively, grinding, plasma etching, or wet etching may be used for the exposure of deep plugs 42.

Figure 7:
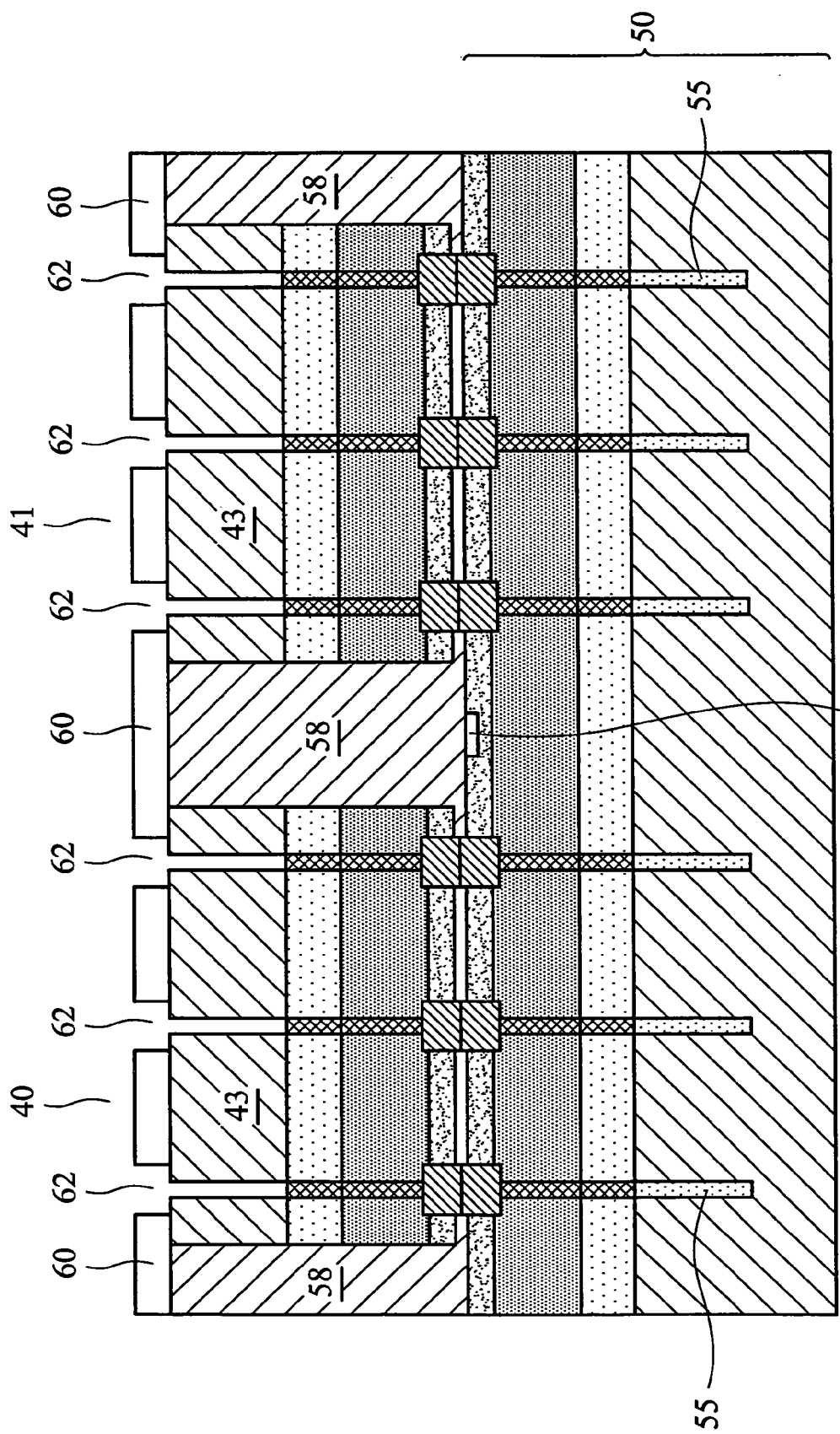

FIG. 7 illustrates the formation and patterning of passivation layer 60, which preferably includes dielectric materials such as oxide or SiN, although other commonly used materials can also be used. Openings 62 are formed in passivation layer 60 to expose deep plugs 42. Deep plugs 42 are then removed, so that openings 62 extend downward until the underlying contact plugs are exposed. Preferably, the patterning of passivation layer 60 and the removal of deep plugs 42 comprise plasma etching. However, wet etching can also be performed.

Figure 8:
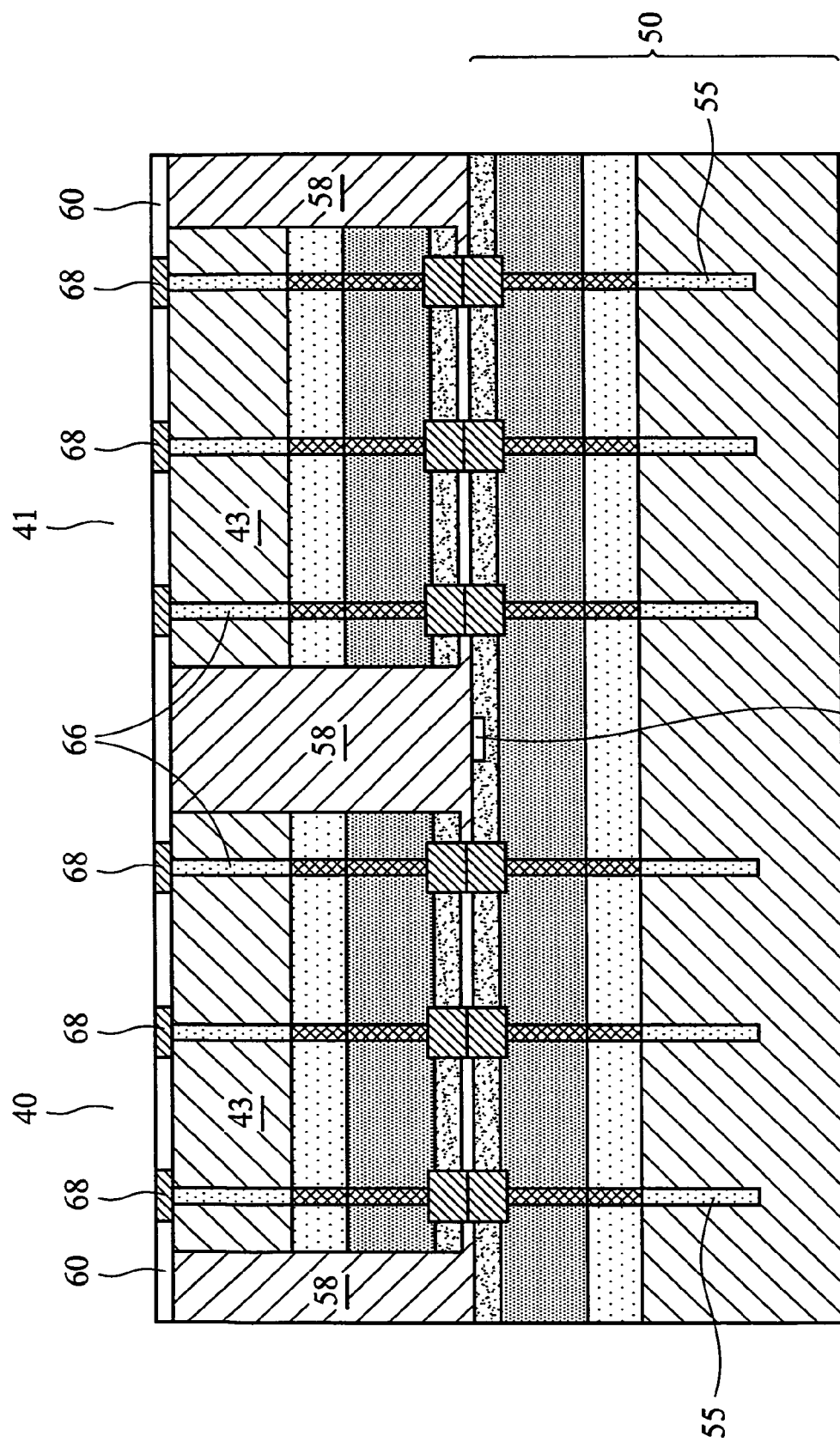

Referring to FIG. 8, openings 62 are filled with conductive materials. Preferably, diffusion barrier layers (not shown), which may include TaN, Ta, TiN, Ti, CoW, are formed in openings 62. A conductive material, which may include copper, tungsten, aluminum, silver, and combinations thereof, is then filled into the remaining portions of openings 62, forming through-silicon vias 66 in semiconductor substrate 43 and contact pads 68 in passivation layer 60.

Figure 9:
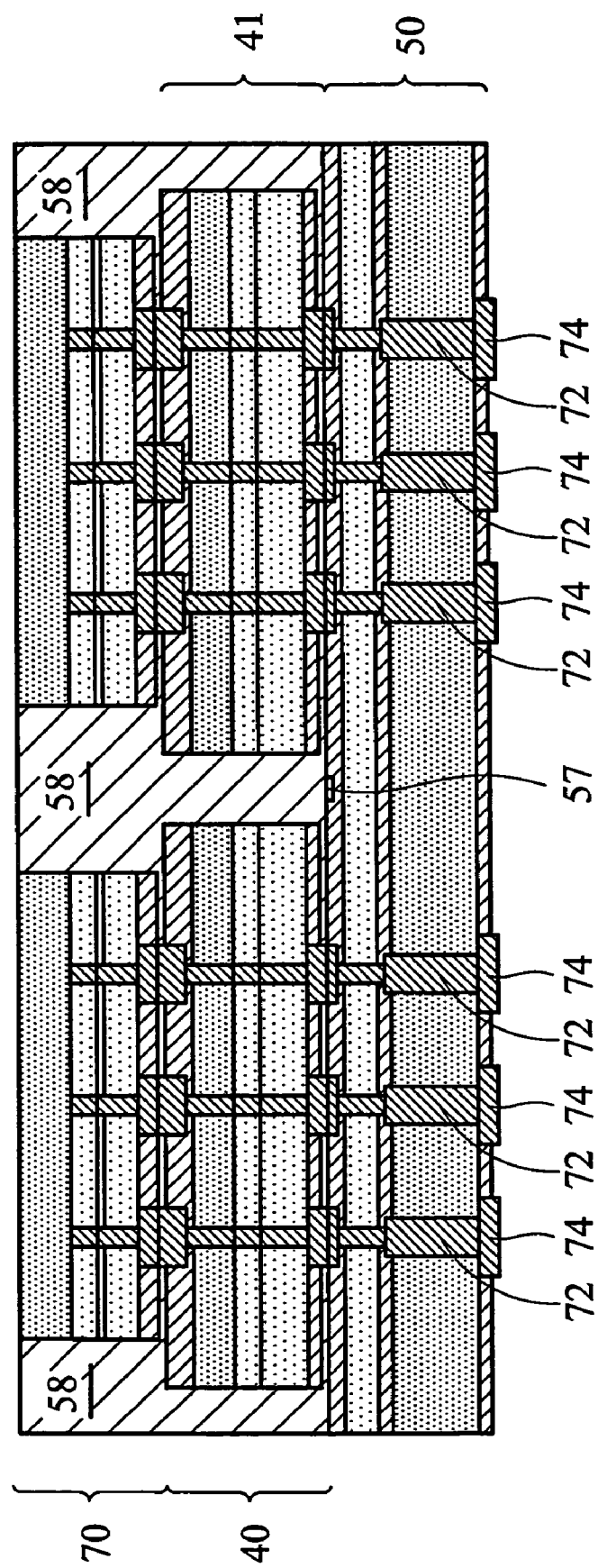

Referring to FIG. 9, processes continue to stack more dies or wafers, such as dies 70 on the stack structure. If the dies or wafer stacked on dies 40 and 41 are intermediate dies, then they preferably includes through-silicon vias. Conversely, if the dies or the wafer are the top dies or wafer, they preferably include no through-silicon vias. For each layer of the stacked dies, coating 58 is preferably filled into the space between the dies, followed by a CMP process. Again, coating 58 is preferably transparent or semi-transparent. Alternatively, after the bonding of dies 40 and 41, coating 58 is not applied. Coating 58 is applied only after all dies including dies 40, 41 and top layer dies (for example, dies 70) are bonded.

FIG. 9 also illustrates the formation of through-silicon vias 72 in bottom wafer 50, followed by the formation of bonding pads 74, also referred to as under bump metallurgies (UBMs) 74. The process steps for forming through-silicon vias 72 and bonding pads 74 are essentially the same as the process steps illustrated in FIGS. 6 through 8, which includes a CMP process to thin bottom wafer 50 in order to expose deep plugs 55 (refer to FIG. 8) and forming a passivation layer covering deep plugs 55. Openings are formed in the passivation layer, followed by the removal of deep plugs 55. The openings are then filled with a conductive material.

In the resulting structure, each of the dies 40, 41 and 70 may have a thickness of between about 1 mil and about 2 mils. Bottom wafer 50 is preferably thicker, with a thickness of between about 2 mils and about 3 mils. The total thickness of the entire structure may thus be less than about 10 mils, or even less than about 5 mils.

Figure 10:
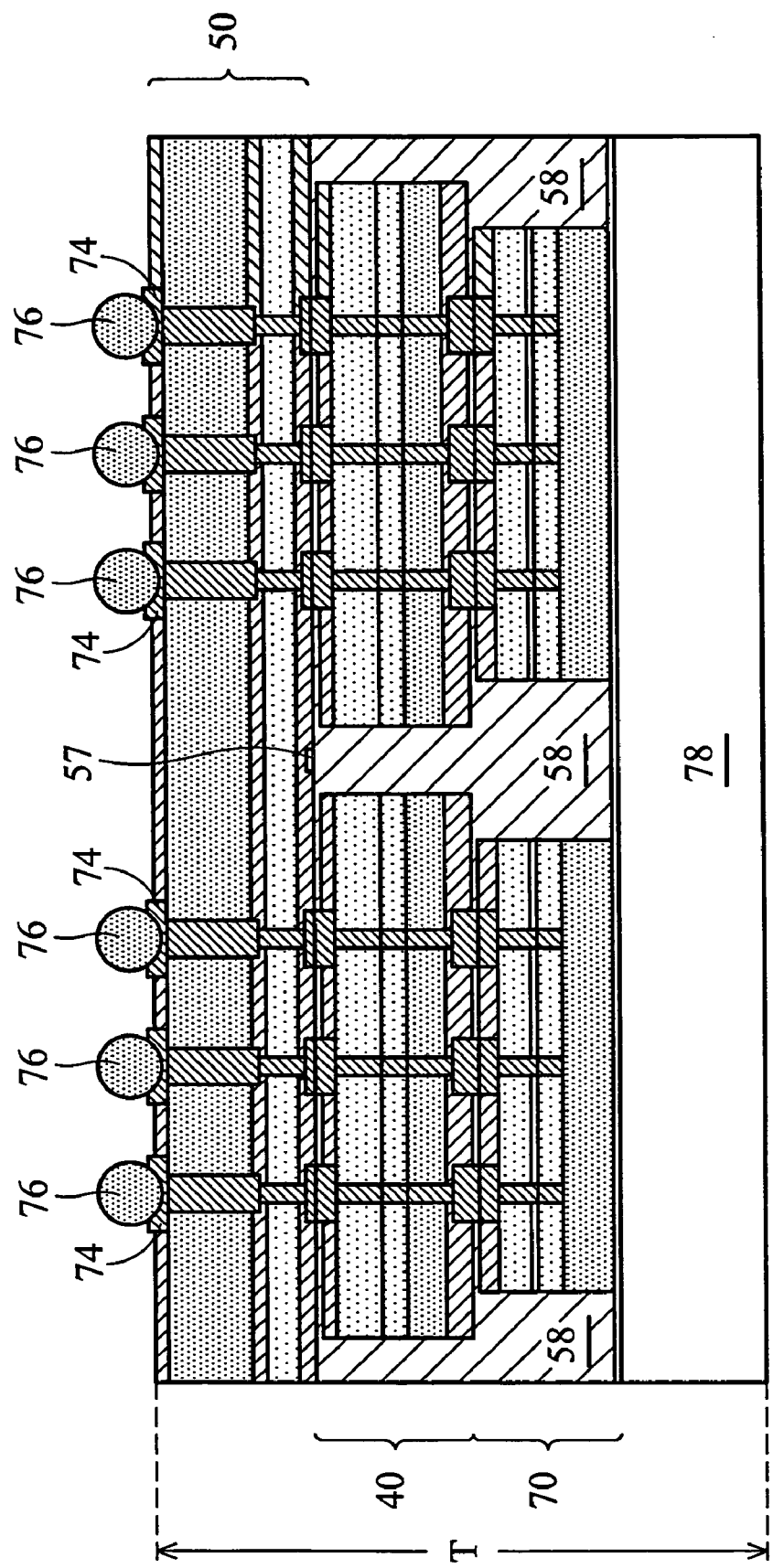

FIG. 10 illustrates the mounting of bumps 76 on bonding pads 74. Please note that FIG. 10 shows a flipped view of the structure shown in FIG. 9. Next, handling wafer 78 is attached. Handling wafer 78 may comprise glass, silicon oxide, aluminum oxide, and the like. An adhesive (not shown) is used to glue handling wafer 78 to top dies 70. In an exemplary embodiment, the adhesive is an ultraviolet (UV) glue, which loses its adhesive property when exposed to UV lights. The preferred thickness of the handling wafer 78 is preferably greater than about 16 mils. The preferred total thickness T of the entire stack structure, including bottom wafer 50, dies 40, 41 and 70, and handling wafer 78, is related to the diameter of the bottom wafer 50, and the larger the bottom wafer is, the greater thickness T is required. For example, for eight-inch wafers, total thickness T is preferably greater than about 19 mils.

Figure 11:
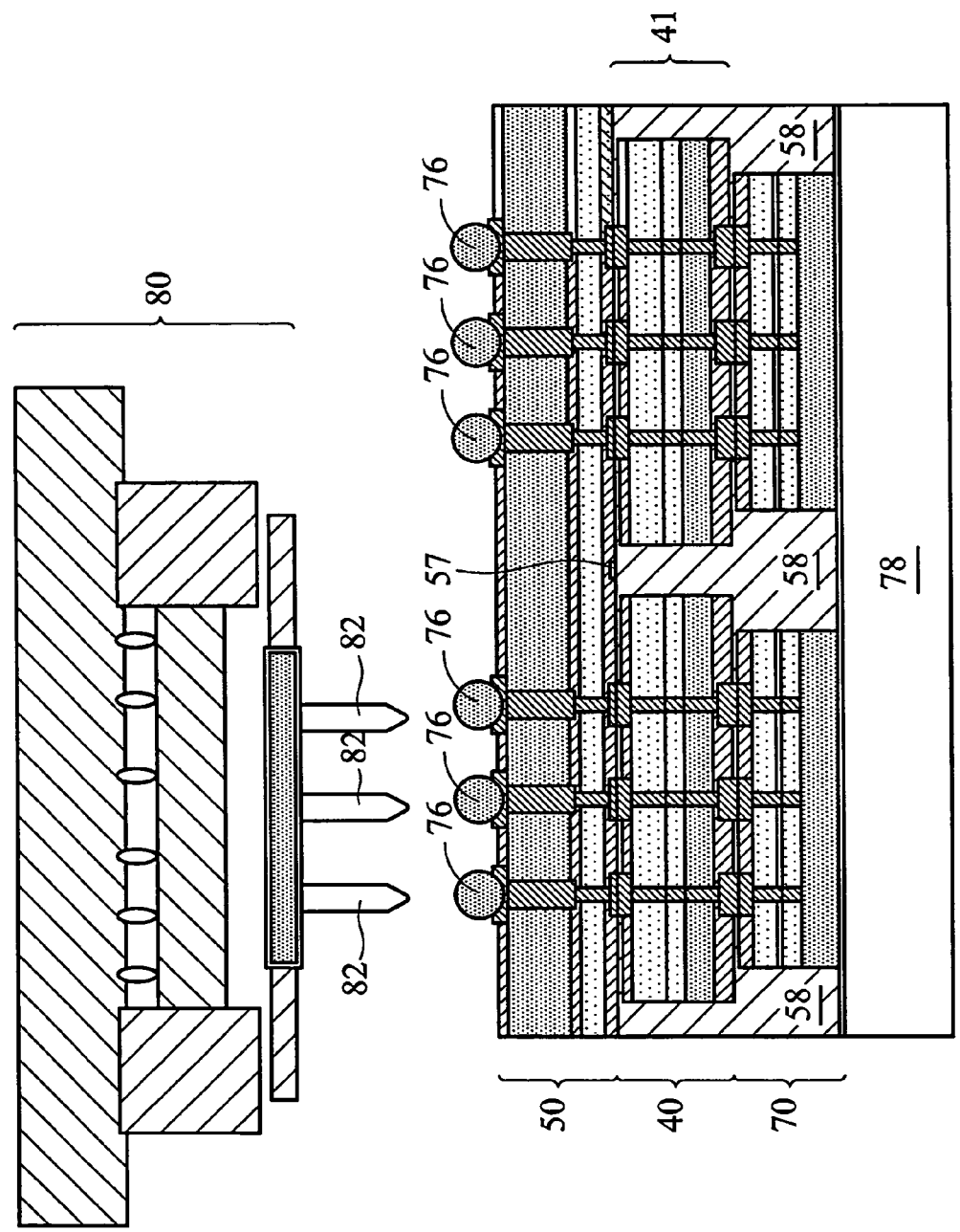

FIG. 11 illustrates an exemplary chip probing process. A probe head 80, which includes a plurality of probe pins 82, are placed against bumps 76. The probe pins 82 are electrically connected to an automated test equipment (not shown). The integrated circuits in the stack structure are then tested, and the quality of each of the chips, which includes stacked dies, are determined. With the mechanical support provided by handling wafer 78, the stack structure is strong enough for the probing process.

In alternatively embodiments, handling wafer 78 is attached to the stack structure before the mounting of bumps 76, and the chip probing process is performed between the steps of attaching handling wafer 78 and mounting bumps 76. The probe pins 82, in this case, are in contact with bonding pads 74. Bumps 76 are formed after the chip probing process, either before, or after the removal of handling wafer 78.

Figure 12:
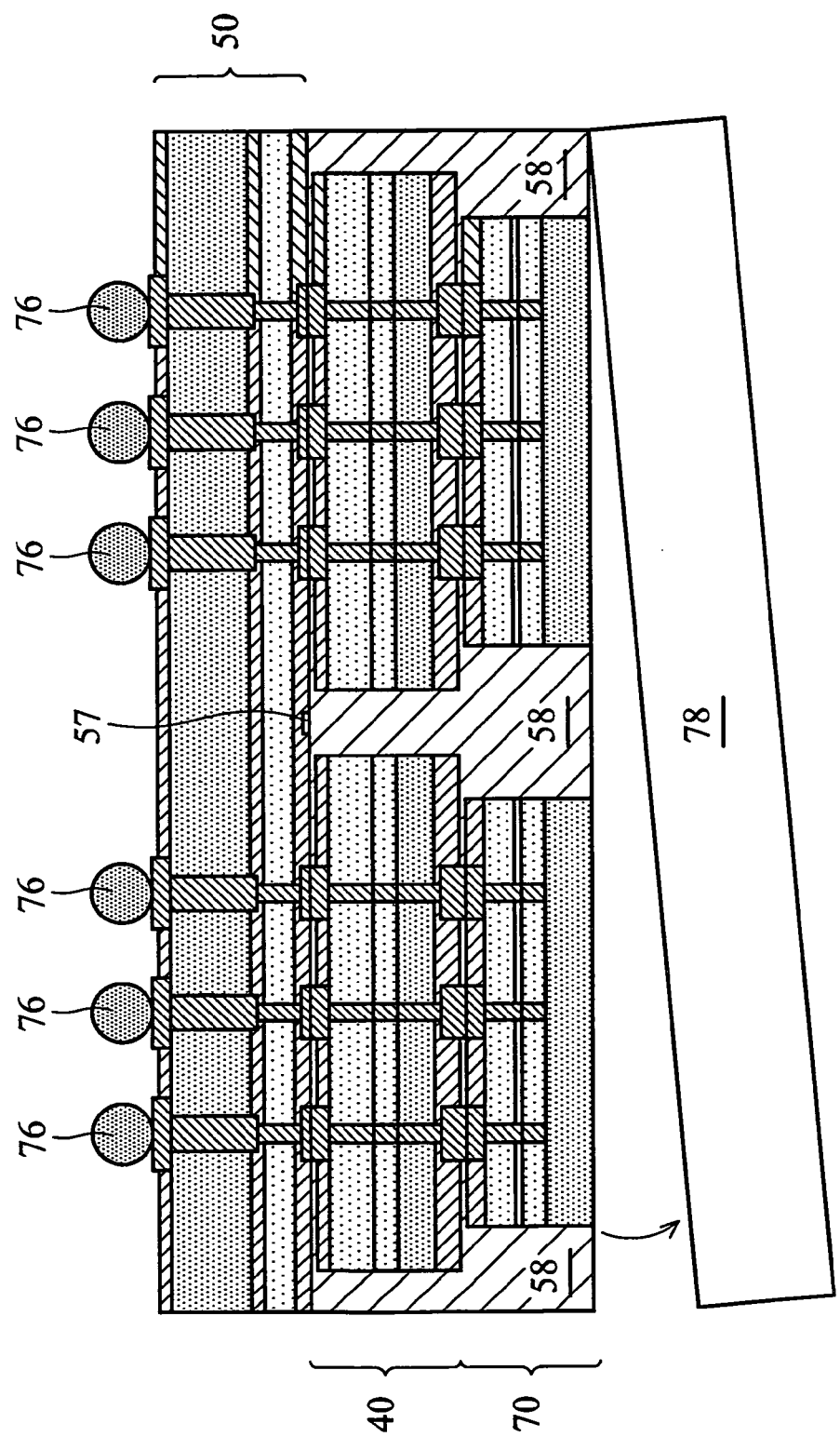

FIG. 12 illustrates the removal of handling wafer 78 from the stack structure. In an exemplary embodiment wherein an UV glue is used, the UV glue is exposed to UV light, the UV glue becomes non-adhesive, and handling wafer 78 is easily detached.

The stack structure shown in FIG. 12 may then by sawed along scribe lines to separate dies. Since coating 58 is transparent or semi-transparent, the marks on bottom wafer 50, such as the schematically illustrated mark 57, may be seen through coating 58 for the identification of scribe lines.

In the embodiment discussed in the preceding paragraphs, die-to-wafer bonding processes are illustrated. One skilled in the art will realize that wafer-to-wafer bonding processes may also be performed. The resulting structure is similar to what is shown in FIG. 12, except dies 40 and 41 are dies in an un-sawed, hence continuous, wafer. Similarly, dies 70 may be dies in a continuous wafer or separate dies. In this case, at least one, and likely more, of the wafers contains through-silicon vias. Since the total thickness of the stack structure may be less than what is required for chip probing purpose, handling wafers may be attached for the chip probing process and removed after the chip probing.

The embodiments of the present invention have several advantageous features. For the convenience of forming through-silicon vias, the dies or wafers having through-silicon vias are typically thin. As a result, the total thicknesses of the stacked dies or wafers are typically only several mils, which cannot satisfy the requirement of chip probing. By attaching a handling wafer, the stack structures can be probed regardless of their thickness. The method of attaching handling wafers for the probing processes is particularly useful for future-generation integrated circuits, in which stacked dies or wafers may be made thinner. In addition, transparent or semi-transparent coatings are used. This solves the difficulty in identify marks through coating.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a stack structure having a first side and a second side opposite the first side, wherein the stack structure comprises a bottom wafer comprising:
      a substrate;
      a plurality of through-silicon vias in the substrate; and
      a plurality of under bump metallurgies (UBMs) connected to the plurality of through-silicon vias, wherein the plurality of UBMs are on the first side of the stack structure;
   attaching a handling wafer on the second side of the stack structure;
   performing a chip probing process to the stack structure through the plurality of through-silicon vias with the handling wafer attached on the stack structure, wherein the handling wafer comprises no electrical connection to the stack structure; and
   removing the handling wafer from the stack structure.

2. The method of claim 1 further comprising bonding a plurality of dies to the bottom wafer, wherein each of the plurality of dies is bonded to a die in the bottom wafer.

3. The method of claim 2, wherein the plurality of dies is physically separated from each other, and wherein the method further comprises:
   filling a coating into spaces between the plurality of dies, wherein the coating is at least semi-transparent; and
   performing a chemical mechanical polish (CMP) to planarize a surface of the coating.

4. The method of claim 3, wherein the plurality of dies each comprises through-silicon vias, and wherein the method further comprises bonding additional dies each on one of the plurality of dies.

5. The method of claim 2, wherein the plurality of dies are portions of a continuous wafer.

6. The method of claim 1 further comprising mounting a plurality of bumps each on one of the UBMs, wherein the step of performing the chip probing process is performed after the step of mounting the plurality of bumps.

7. The method of claim 1 further comprising mounting a plurality of bumps each on one of the UBMs, wherein the chip probing process is performed before the step of mounting the plurality of bumps.

8. The method of claim 1 further comprising sawing the stack structure after the step of removing the handling wafer.

9. The method of claim 1 further comprising an adhesive between the stack structure and the handling wafer, wherein a majority of a surface of the handling wafer facing the stack structure and a majority of a surface of the stack structure facing the handling wafer contact the adhesive.

10. A method of forming a semiconductor structure, the method comprising:
    providing a bottom wafer comprising:
       a substrate;
       an interconnect structure on the bottom wafer; and
       a first plurality of bonding pads on the interconnect structure;
    bonding a first plurality of dies on the bottom wafer, wherein each of the first plurality of dies comprises a first plurality of through-silicon vias and a second plurality of bonding pads connected to the first plurality of through-silicon vias, and wherein each of the first plurality of bonding pads is bonded to one of the second plurality of bonding pads;
    forming a second plurality of through-silicon vias in the substrate of the bottom wafer;
    forming a plurality of under bump metallurgies (UBMs) on a first side of the bottom wafer, wherein the plurality of UBMs is connected to the second plurality of through-silicon vias;
    mounting a plurality of bumps each on one of the plurality of UBMs;
    attaching a handling wafer over the first plurality of dies, wherein the handling wafer and the bottom wafer are on opposite sides of the first plurality of dies;
    performing a chip probing process to the bottom wafer;
    removing the handling wafer from the semiconductor structure; and
    sawing the semiconductor structure.

11. The method of claim 10 further comprising filling a coating between the first plurality of dies before the step of attaching the handling wafer.

12. The method of claim 11, wherein the coating is transparent or semi-transparent.

13. The method of claim 12 further comprising forming marks on the bottom wafer, wherein the marks are identified through the coating during the step of sawing.

14. The method of claim 10, wherein the first plurality of dies each comprises a plurality of through-silicon vias, and wherein the method further comprises bonding a second plurality of dies each on one of the first plurality of dies before the step of attaching the handling wafer.

15. The method of claim 10, wherein the handling wafer comprises glass.

16. The method of claim 10, wherein the first plurality of dies are portions of a continuous wafer.

17. A method of probing dies, the method comprising:
    providing a stack structure;
    attaching a handling wafer on the stack structure, wherein the handling wafer is a dielectric wafer comprising no current loop-back circuit electrically connected to the stack structure;
    probing the stack structure with the handling wafer attached on the stack structure when the step of probing is performed;
    removing the handling wafer after the step of probing; and
    sawing the stack structure into separate dies.

18. The method of claim 17, wherein the stack structure has a total thickness less than about 5 mils, and wherein the handling wafer and the stack structure have a combined thickness greater than about 19 mils.

19. The method of claim 17, wherein the stack structure comprises a bottom wafer comprising through-silicon vias, and wherein the step of probing is performed through the through-silicon vias.

20. The method of claim 19, wherein the stack structure further comprises dies or wafers bonded on the bottom wafer, and wherein the dies or wafers are between the bottom wafer and the handling wafer.

* * * * *